(12) United States Patent  (10) Patent No.: US 12,315,773 B2
Wang  (45) Date of Patent: May 27, 2025

(54) CHIP SCALE PACKAGE (CSP) PROCESS

(71) Applicant: CHANGZHOU GALAXY CENTURY MICROELECTRONICS CO., LTD, Changzhou (CN)

(72) Inventor: Yueyun Wang, Changzhou (CN)

(73) Assignee: CHANGZHOU GALAXY CENTURY MICROELECTRONICS CO., LTD, Changzhou (CN)

(*) Notice: Subject to any disclaimer, the term of this patent is extended or adjusted under 35 U.S.C. 154(b) by 481 days.

(21) Appl. No.: 17/951,161

(22) Filed: Sep. 23, 2022

(65) Prior Publication Data

US 2023/0378008 A1 Nov. 23, 2023

Related U.S. Application Data

(63) Continuation of application No. PCT/CN2022/095834, filed on May 30, 2022.

(30) Foreign Application Priority Data

May 23, 2022 (CN) .......................... 202210566629.7

(51) Int. Cl.
 *H01L 21/56* (2006.01)
 *H01L 23/31* (2006.01)
 *H10D 84/03* (2025.01)
(52) U.S. Cl.
 CPC ........ *H01L 23/3114* (2013.01); *H01L 21/561* (2013.01); *H10D 84/038* (2025.01)

(58) Field of Classification Search
 None
 See application file for complete search history.

(56) References Cited

U.S. PATENT DOCUMENTS 6,686,225 B2 * 2/2004 Wachtler ............. H01L 21/6835
 257/E29.022
9,076,859 B2 * 7/2015 Harikai ................ H01J 37/321
 (Continued)

FOREIGN PATENT DOCUMENTS

CN  105140184 A  12/2015
CN  107134438 A  9/2017
 (Continued)

*Primary Examiner* — Nicholas J Tobergte
(74) *Attorney, Agent, or Firm* — Bayramoglu Law Offices LLC

(57) ABSTRACT

A chip scale package process includes: forming a groove on an upper surface of a multi-device wafer; forming a passivation layer on the upper surface and in the groove; forming an opening of the passivation layer; forming a metal bump in the opening; adding a protective layer on the upper surface and in the groove; conducting a treatment after adding the protective layer on the upper surface and in the groove to expose the metal bump; attaching a carrier to the upper surface and grinding a lower surface of the wafer to penetrate a bottom of the groove; and forming a metal layer on the lower surface and separating the carrier from the wafer to form multiple packaged devices. The CSP process avoids the need for a multi-cut process on the surface of the wafer, thereby simplifying the technological process, reducing the production cost, and improving the processing efficiency.

9 Claims, 4 Drawing Sheets

(56) References Cited

U.S. PATENT DOCUMENTS

2002/0037631 A1\* 3/2002 Mimata ............... H01L 21/6836
                                                                257/E21.705
2003/0143819 A1\* 7/2003 Hedler .................... H01L 21/78
                                                                257/E21.599
2008/0230898 A1\* 9/2008 Meguro ................ H01L 21/561
                                                                257/737

FOREIGN PATENT DOCUMENTS

CN      109979902 A    7/2019
CN      113764288 A    12/2021

\* cited by examiner

```
┌─────────────────────────────────────────────────────────────────┐
│  Form a groove on an upper surface of a multi-device wafer,     │
│  wherein a depth of the groove is a designed thickness of a     │
│  product                                                         │
└─────────────────────────────────────────────────────────────────┘
                              │
                              ▼
┌─────────────────────────────────────────────────────────────────┐
│  Perform passivation treatment on the upper surface of the       │
│  wafer and a surface of the groove, wherein a space is           │
│  reserved in the groove                                          │
└─────────────────────────────────────────────────────────────────┘
                              │
                              ▼
┌─────────────────────────────────────────────────────────────────┐
│  Form an opening on the upper surface of the wafer, perform      │
│  metallization treatment in the opening to form a metal bump,    │
│  and add a protective layer on the upper surface of the wafer    │
│  and the surface of the groove, wherein a space is maintained    │
│  in the groove                                                   │
└─────────────────────────────────────────────────────────────────┘
                              │
                              ▼
┌─────────────────────────────────────────────────────────────────┐
│  Attach a carrier to the upper surface of the wafer, and grind   │
│  a lower surface of the wafer to penetrate a bottom of the       │
│  groove                                                          │
└─────────────────────────────────────────────────────────────────┘
                              │
                              ▼
┌─────────────────────────────────────────────────────────────────┐
│  Perform protection treatment or metallization treatment on the  │
│  lower surface of the wafer, and separate the carrier from the   │
│  wafer to form packaged devices                                  │
└─────────────────────────────────────────────────────────────────┘
```

FIG. 1

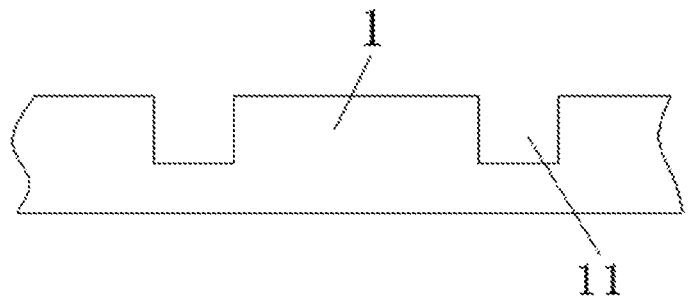

FIG. 2

CHIP SCALE PACKAGE (CSP) PROCESS

CROSS REFERENCE TO THE RELATED APPLICATIONS

The application is a Continuation application of International Application No. PCT/CN2022/095834, filed on May 30, 2022, which is based on and claims priority on Chinese patent application No. 202210566629.7, filed on May 23, 2022, the entire contents of which are incorporated herein by reference.

TECHNICAL FIELD

The present disclosure relates to the technical field of chip package and, in particular, to a chip scale package (CSP) process.

BACKGROUND

With the global demand for personalized and lightweight electronic products, packaging technology has advanced to chip scale package (CSP), which significantly reduces the size of the chip package. The size of the packaged device does not exceed 1.2 times the size of the chip, and the area of the packaged device does not exceed 1.4 times the area of the die. There are four types of CSP processes, namely lead frame type, rigid interposer type, flexible interposer type, and wafer level package.

In the existing wafer level package, the upper and lower surfaces of the wafer are cut at least once, but such a multi-cut process on the wafer is complicated, has a strict requirement for accuracy, and prone to causing defective devices due to the cumbersome cutting method.

SUMMARY

An objective of the present disclosure is to provide a chip scale package (CSP) process. The present disclosure solves the problems of the existing multi-cut process on the wafer, that is, the cutting method is complicated and prone to cause defective products due to the cumbersome cutting method.

To solve the above technical problems, the present disclosure adopts the following technical solution.

A CSP process includes the following steps:
- S1: forming a groove on an upper surface of a multi-device wafer, wherein a depth of the groove is a designed thickness of a product;
- S2: performing a passivation treatment on the upper surface of the wafer and an inner surface of the groove to form a passivation layer, where a space is reserved in the groove;
- S3: forming an opening of the passivation layer on the upper surface of the wafer;
- S4: performing a metallization treatment in the opening to form a metal bump;
- S5: adding a protective layer on the upper surface of the wafer and the inner surface of the groove, where a space is reserved in the groove;
- S6: conducting a treatment after adding the protective layer on the upper surface of the wafer and the inner surface of the groove to expose the metal bump;
- S7: attaching a carrier to the upper surface of the wafer and grinding the lower surface of the wafer to penetrate the bottom of the groove; and
- S8: forming a metal layer on the lower surface of the wafer and separating the carrier from the wafer to form multiple packaged devices.

Specifically, the CSP process provided by the present disclosure avoids the need for a multi-cut process on the surface of the wafer, thereby simplifying the technological process, reducing the production cost, and improving the processing efficiency. The metal bump serves as an electrode of the device.

Further, in the CSP process, in step S1, the groove may be formed by at least one or a combination of mechanical cutting, chemical etching, plasma cutting, and laser cutting.

Further, in the CSP process, in step S2, the passivation treatment may be performed with at least one or a combination of two or more selected from the group consisting of $SiO_2$, $SiN_x$, and semi-insulating polycrystalline silicon (SIPOS) to form at least one passivation layer.

Specifically, there are one or more passivation layers formed. The passivation treatment is performed on the upper surface of the wafer to form the passivation layer. The passivation layer can insulate between n-p electrodes. It can also protect the wafer and prevent impurity atoms from being adsorbed on the wafer, thereby reducing the surface leakage current and improving the reliability of the device.

Further, in the CSP process, in step S3, the opening may be formed by photolithography.

Further, in the CSP process, in step S4, the metallization treatment may be performed by electroless plating, electroplating, reballing, or chemical vapor deposition (CVD).

Further, in the CSP process, in step S5, the protective layer may be added by coating or attaching an inorganic material, an epoxy resin, silicone, or a polyimide (PI) film.

Further, in the CSP process, step S6 may specifically include performing photolithography or polishing on the upper surface of the wafer after adding the protective layer on the upper surface of the wafer and the inner surface of the groove to expose the metal bump.

Further, in the CSP process, step S8 may specifically include performing a protection treatment or metallization treatment on the lower surface of the wafer to form the metal layer and separating the carrier from the wafer to form multiple packaged devices, where the protection treatment or metallization treatment is performed by electroless plating, sputtering, electroplating, or film attachment.

Further, in the CSP process, step S8 may specifically include performing a protection treatment or metallization treatment on the lower surface of the wafer to form the metal layer, marking a lower surface of each of the devices located on the carrier, and separating the carrier from the wafer to form multiple packaged devices. Preferably, the multiple device units on the carrier are collectively marked, which greatly improves the marking efficiency.

The present disclosure has the following beneficial effects:

(1) In the present disclosure, the groove having a depth as a designed thickness of a product is provided on the upper surface of the multi-device wafer. The carrier is attached to the upper surface of the wafer, and the lower surface of the wafer is ground to penetrate the bottom of the groove. The carrier is separated from the wafer to form the packaged device. The present disclosure provides a process that avoids the need for a multi-cut process on the surface of the wafer, thereby simplifying the technological process, reducing the production cost, and improving the processing efficiency.

(2) In the present disclosure, the lower surface of the wafer on the carrier is ground to penetrate the bottom of the groove and is subjected to the protection treatment or metallization treatment to form multiple device units. The grinding process greatly improves the flatness and facilitates the collective marking of the multiple device units integrated on the carrier, thereby greatly improving the efficiency.

BRIEF DESCRIPTION OF THE DRAWINGS

In order to describe the technical solutions in the embodiments of the present disclosure more clearly, the accompanying drawings required for describing the embodiments are briefly described below. Obviously, the accompanying drawings in the following description show merely some embodiments of the present disclosure, and a person of ordinary skill in the art would also be able to derive other accompanying drawings from these accompanying drawings without creative efforts.

FIG. 1 is a flowchart of a chip scale package (CSP) process according to Embodiment 1 of the present disclosure.

FIG. 2 is a schematic diagram of forming a groove on an upper surface of a multi-device wafer by the CSP process according to Embodiment 1 of the present disclosure.

Figure 3:
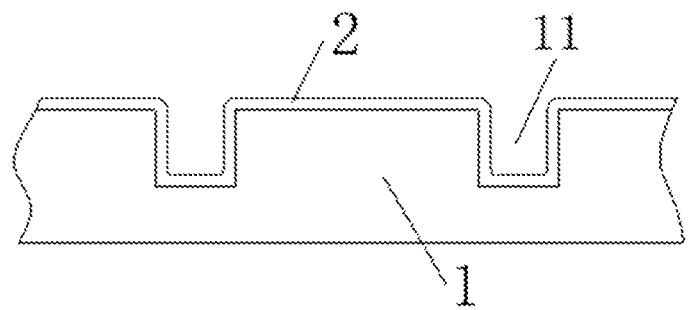
FIG. 3 is a schematic diagram of performing a passivation treatment on the upper surface of the wafer and a surface of the groove by the CSP process according to Embodiment 1 of the present disclosure.

REFERENCE NUMERALS 1. wafer; 2. passivation layer; 3. opening; 4. metal bump; 5. protective layer; 6. carrier; 61. glue; 7. metal layer; and 11. groove.

DETAILED DESCRIPTION OF THE EMBODIMENTS

The following clearly and completely describes the technical solutions in the embodiments of the present disclosure with reference to the accompanying drawings. It will be apparent that the described embodiments are merely a part, rather than all, of the embodiments of the present disclosure. The following description of at least one exemplary embodiment is merely illustrative and not intended to limit the present disclosure and application or use thereof in any way. All other embodiments obtained by a person of ordinary skill in the art based on the embodiments of the present disclosure without creative efforts shall fall within the protection scope of the present disclosure.

Embodiment 1

A chip scale package (CSP) process includes the following steps:
S1. Form a groove 11 (FIG. 2) on an upper surface of a multi-device wafer 1, wherein groove 11 has a depth forming a designed device thickness. Groove 11 may be formed by at least one or a combination of mechanical cutting, chemical etching, plasma cutting, and laser cutting. In this step, groove 11 is formed by mechanical cutting. Referring to FIG. 2, wafer 1 is provided with multiple devices and a grooved region located between the devices. No device is provided in the grooved region. Groove 11 is formed in the grooved region. A portion between adjacent grooves 11 of wafer 1 may serve as a prototype of a device to be packaged.

S2. Perform a passivation treatment on the upper surface of wafer 1 and an inner surface of groove 11 to form a passivation layer 2, where a space is reserved in groove 11. The passivation treatment is performed with at least one or a combination of two or more selected from the group consisting of $SiO_2$, $SiNx$, and semi-insulating polycrystalline silicon (SIPOS). In this step, one passivation layer 2 is formed from SiNx. Referring to FIG. 3, the passivation treatment is performed on the upper surface of wafer 1 to form passivation layer 2. The passivation layer 2 can insulate between n-p electrodes. It can also protect wafer 1 and prevent impurity atoms from being adsorbed on wafer 1, thereby reducing the surface leakage current and improving the reliability of the device.

Figure 4:
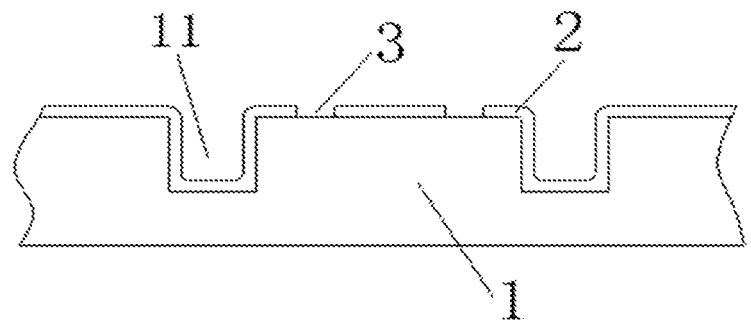
FIG. 4 is a schematic diagram of forming an opening on the upper surface of the wafer by the CSP process according to Embodiment 1 of the present disclosure.

S3. Form an opening 3 of the passivation layer 2 on the upper surface of wafer 1 (FIG. 4), where the opening 3 is formed by photolithography.

Figure 5:
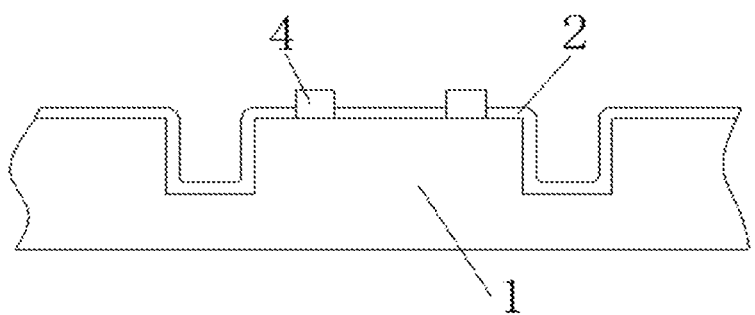
FIG. 5 is a schematic diagram of performing a metallization treatment in the opening to form a metal bump by the CSP process according to Embodiment 1 of the present disclosure.

S4. Perform a metallization treatment in the opening 3 to form a metal bump 4 (FIG. 5), where the metallization treatment is performed by electroless plating, electroplating, reballing, or chemical vapor deposition (CVD). In this step, the metallization treatment is performed by electroless plating.

Figure 6:
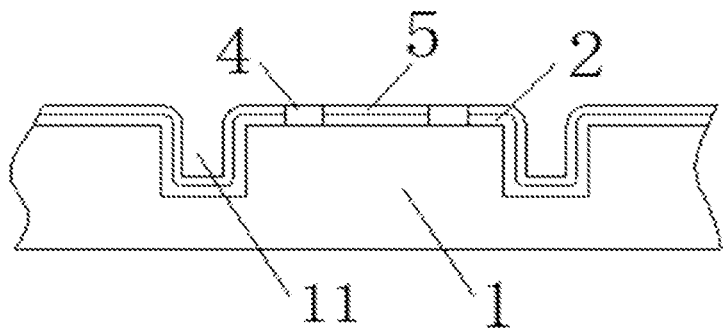
FIG. 6 is a schematic diagram of adding a protective layer on the upper surface of the wafer and the surface of the groove by the CSP process according to Embodiment 1 of the present disclosure.

S5. Add a protective layer 5 on the upper surface of wafer 1 and the inner surface of groove 11, where a space is reserved in groove 11. Referring to FIG. 6, the protective layer 5 is added by coating or attaching an inorganic material, an epoxy resin, silicone, or a polyimide (PI) film. In Embodiment 1, the protective layer is added by coating an inorganic material.

S6. Perform photolithography or polishing on the upper surface of wafer 1 after adding the protective layer 5 on the upper surface of wafer 1 and the inner surface of groove 11 to expose the metal bump 4.

Figure 7:
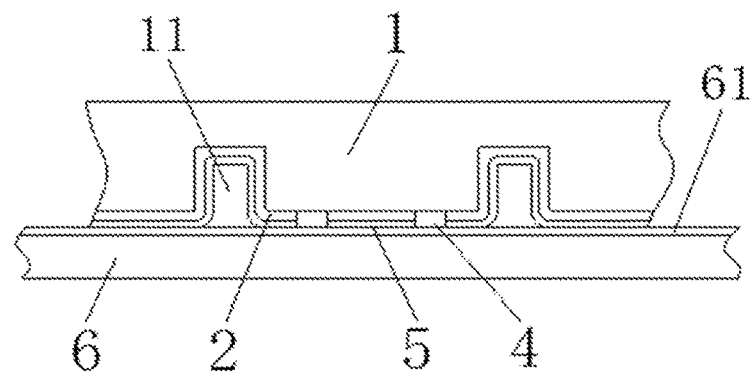
FIG. 7 is a schematic diagram of attaching a carrier to the upper surface of the wafer by the CSP process according to Embodiment 1 of the present disclosure.

S7. Attach a carrier 6 to the upper surface of wafer 1, and grind a lower surface of wafer 1 to penetrate the bottom of the groove 11. Referring to FIG. 7, FIG. 7 is a schematic diagram of attaching wafer 1 to carrier 6. In this step, one side of carrier 6 is provided with glue 61, through which the side of carrier 6 is fixedly connected to the upper surface of wafer 1.

Figure 8:
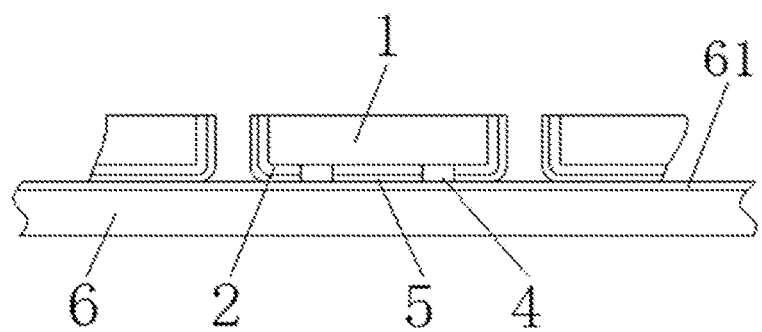
FIG. 8 is a schematic diagram of grinding a lower surface of the wafer to penetrate a bottom of the groove by the CSP process according to Embodiment 1 of the present disclosure.
Figure 9:
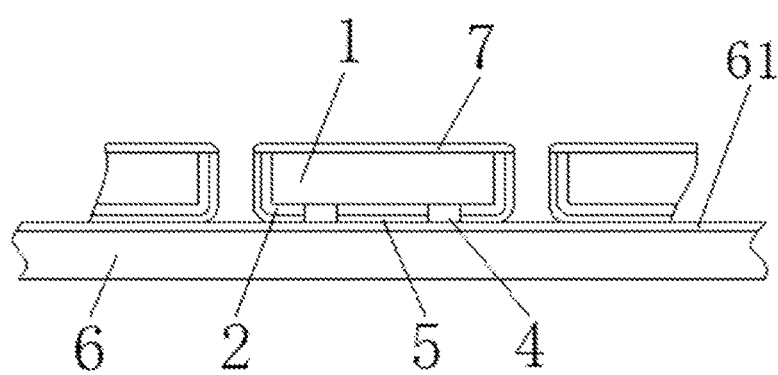
FIG. 9 is a schematic diagram of performing a protection treatment or metallization treatment on the lower surface of the wafer by the CSP process according to Embodiment 1 of the present disclosure.
Figure 10:
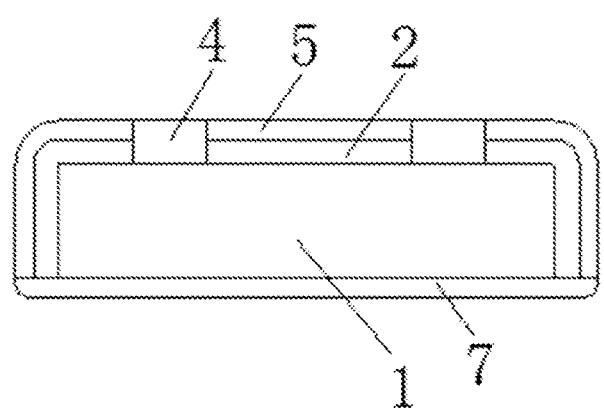
FIG. 10 is a schematic diagram of separating the carrier from the wafer to form packaged devices by the CSP process according to Embodiment 1 of the present disclosure.
Figure 11:
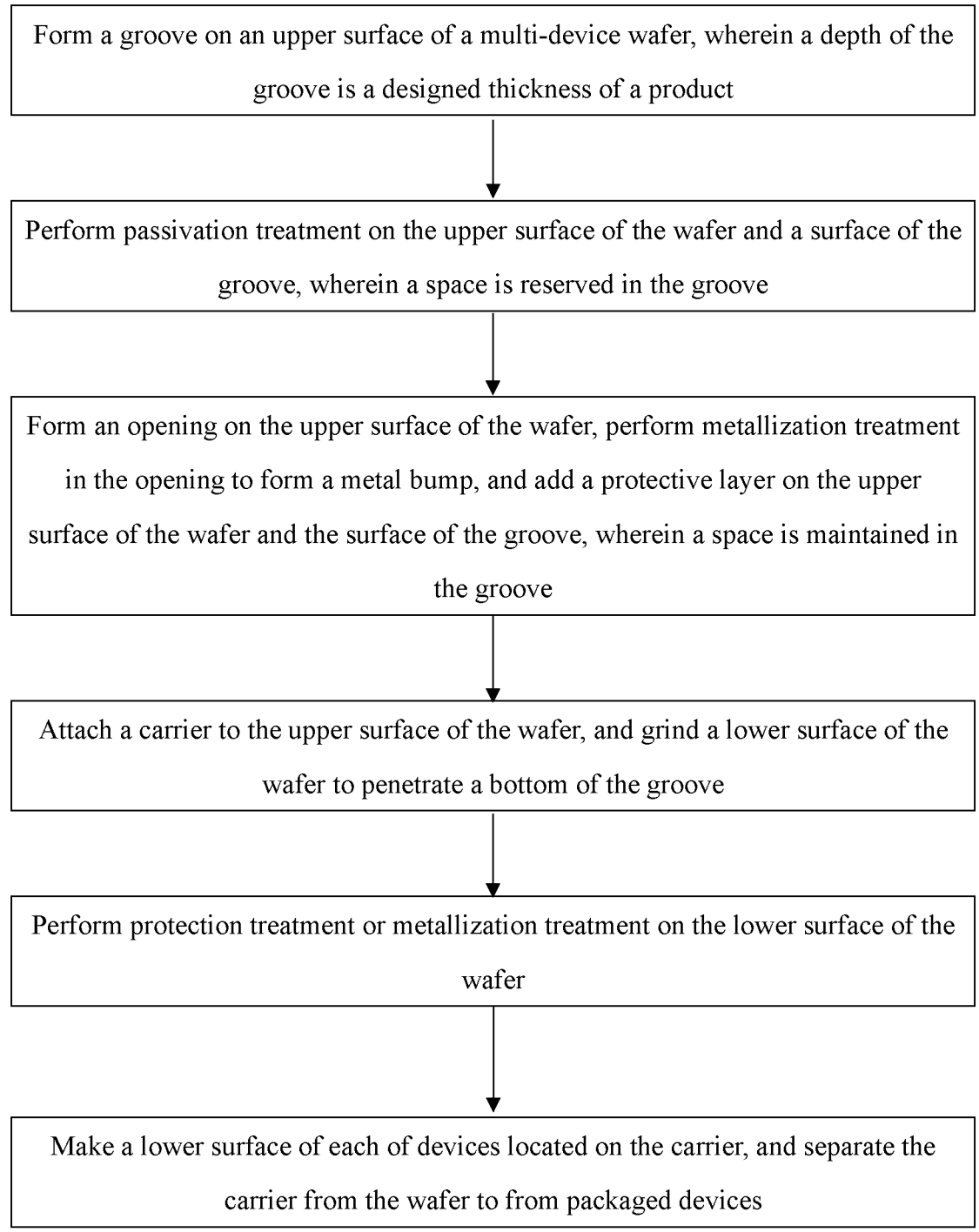
FIG. 11 is a flowchart of a CSP process according to Embodiment 2 of the present disclosure.

S8. Perform a protection treatment or metallization treatment on the lower surface of wafer 1 to form a metal layer 7 and separate carrier 6 from wafer 1 to form multiple packaged devices. In this step, the protection treatment or metallization treatment is performed by electroless plating, sputtering, electroplating, or film attachment. In Embodiment 1, the protection treatment or metallization treatment is performed by sputtering. Referring to FIG. 8, FIG. 8 is a schematic diagram after grinding the lower surface of the wafer. It should be noted that, in this step, there is a space in groove 11, that is, groove 11 is not blocked or filled. By grinding the lower surface of wafer 1 to the bottom of groove 11, the bottom of groove 11 is penetrated. Thus, the multi-device wafer 1 is divided into multiple device units by multiple penetrated grooves 11.

Embodiment 2

A CSP process includes the following steps:

S1. Form a groove 11 (FIG. 2) on an upper surface of a multi-device wafer 1, wherein a depth of groove 11 is a designed thickness of a product. Groove 11 may be formed by at least one or a combination of mechanical cutting, chemical etching, plasma cutting, and laser cutting. In this step, groove 11 is formed by mechanical cutting. Referring to FIG. 2, wafer 1 is provided with multiple devices and a grooved region located between the devices. No device is provided in the grooved region. Groove 11 is formed in the grooved region. A portion between adjacent grooves 11 of wafer 1 serves as a prototype of a device to be packaged.

S2. Perform a passivation treatment on the upper surface of wafer 1 and an inner surface of groove 11 to form a passivation layer 2, where a space is reserved in groove 11. The passivation treatment is performed with at least one or a combination of two or more selected from the group consisting of $SiO_2$, SiNx, and semi-insulating polycrystalline silicon (SIPOS). In this step, one passivation layer 2 is formed from SiNx. Referring to FIG. 3, the passivation treatment is performed on the upper surface of wafer 1 to form passivation layer 2. The passivation layer 2 can insulate between n-p electrodes. It can also protect wafer 1 and prevent impurity atoms from being adsorbed on wafer 1, thereby reducing the surface leakage current and improving the reliability of the device.

S3. Form an opening 3 of the passivation layer 2 on the upper surface of wafer 1 (FIG. 4), where the opening 3 is formed by photolithography.

S4. Perform a metallization treatment in the opening 3 to form a metal bump 4 (FIG. 5), where the metallization treatment is performed by electroless plating, electroplating, reballing, or chemical vapor deposition (CVD). In this step, the metallization treatment is performed by electroless plating. The metal bump 4 serves as an electrode of the device.

S5. Add a protective layer 5 on the upper surface of wafer 1 and the inner surface of groove 11, where a space is reserved in groove 11. Referring to FIG. 6, the protective layer 5 is added by coating or attaching an inorganic material, an epoxy resin, silicone, or a polyimide (PI) film. In Embodiment 2, the protective layer is added by coating an inorganic material.

S6. Perform photolithography or polishing on the upper surface of wafer 1 after adding the protective layer 5 on the upper surface of wafer 1 and the inner surface of groove 11 to expose the metal bump 4.

S7. Attach a carrier 6 to the upper surface of wafer 1 and grind a lower surface of wafer 1 to penetrate the bottom of the groove 11. FIG. 7 shows wafer 1 attached to carrier 6. In this step, one side of carrier 6 is provided with glue 61, through which the side of carrier 6 is fixedly connected to the upper surface of wafer 1.

S8. Perform a protection treatment or metallization treatment on the lower surface of wafer 1 to form a metal layer 7, mark a lower surface of each of the devices located on carrier 6, and separate carrier 6 from wafer 1 to form multiple packaged devices.

The difference between Embodiment 2 and Embodiment 1 is that, in step S8, after the protection treatment or metallization treatment is performed on the lower surface of the wafer, the multiple device units on the carrier 6 are collectively marked, which greatly improves the marking efficiency.

The CSP process provided by the present disclosure avoids the need for the multi-cut process on the surface of the wafer, thereby simplifying the technological process, reducing the production cost, and improving the processing efficiency. The CSP process of the present disclosure also greatly improves the flatness and facilitates the collective marking of the multiple device units integrated on the carrier, thereby greatly improving the efficiency.

The preferred embodiments of the present disclosure are merely intended to explain the present disclosure rather than to limit the present disclosure. Any obvious changes or modifications made to the technical solution of the present disclosure should fall within the protection scope of the present disclosure.

What is claimed is:

1. A chip scale package (CSP) process comprising the following steps:
   S1: forming a groove on an upper surface of a multi-device wafer, wherein a depth of the groove is a designed thickness of a product;
   S2: performing a passivation treatment on the upper surface of the multi-device wafer and an inner surface of the groove to form a passivation layer, wherein a space is reserved in the groove;
   S3: forming an opening of the passivation layer on the upper surface of the multi-device wafer;
   S4: performing a metallization treatment in the opening to form a metal bump;
   S5: adding a protective layer on the upper surface of the multi-device wafer and the inner surface of the groove, wherein the space is reserved in the groove;
   S6: conducting a treatment after adding the protective layer on the upper surface of the multi-device wafer and the inner surface of the groove to expose the metal bump;
   S7: attaching a carrier to the upper surface of the multi-device wafer and grinding a lower surface of the multi-device wafer to penetrate a bottom of the groove; and
   S8: forming a metal layer on the lower surface of the multi-device wafer and separating the carrier from the multi-device wafer to form multiple packaged devices.

2. The CSP process according to claim 1, wherein in step S1, the groove is formed by at least one process or a combination of two or more processes consisting of mechanical cutting, chemical etching, plasma cutting, and laser cutting.

3. The CSP process according to claim 1, wherein in step S2, the passivation treatment is performed with at least one chemical compound or a combination of two or more chemical compounds consisting of $SiO_2$, $SiN_x$, and semi-insulating polycrystalline silicon (SIPOS), wherein a number of the passivation layer is at least one.

4. The CSP process according to claim 1, wherein in step S3, the opening is formed by photolithography.

5. The CSP process according to claim 1, wherein in step S4, the metallization treatment is performed by electroless plating, electroplating, reballing, or chemical vapor deposition (CVD).

6. The CSP process according to claim 1, wherein in step S5, the protective layer is added by coating or attaching an inorganic material, an epoxy resin, silicone, or a polyimide (PI) film.

7. The CSP process according to claim 1, step S6 further comprising
    performing photolithography or polishing on the upper surface of the multi-device wafer after adding the protective layer on the upper surface of the multi-device wafer and the inner surface of the groove to expose the metal bump.

8. The CSP process according to claim 1, step S8 further comprising
    performing a protection treatment or the metallization treatment on the lower surface of the multi-device wafer to form the metal layer and separating the carrier from the multi-device wafer to form the multiple packaged devices,
    wherein the protection treatment or the metallization treatment is performed by electroless plating, sputtering, electroplating, or film attachment.

9. The CSP process according to claim 8, the step S8 further comprising
    after performing the protection treatment or the metallization treatment on the lower surface of the multi-device wafer to form the metal layer, marking a lower surface of each of a plurality of devices located on the carrier.

\* \* \* \* \*